United States Patent
Otsubo et al.

(10) Patent No.: US 11,152,327 B2
(45) Date of Patent: Oct. 19, 2021

(54) SEMICONDUCTOR DEVICE WITH FUSE PORTION COMPRISING WIRES OF DIFFERENT ELECTRICAL RESISTANCE

(71) Applicant: Mitsubishi Electric Corporation, Tokyo (JP)

(72) Inventors: Yoshitaka Otsubo, Tokyo (JP); Shun Tonooka, Tokyo (JP); Tetsuya Matsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/738,592

(22) Filed: Jan. 9, 2020

(65) Prior Publication Data

US 2020/0303338 A1 Sep. 24, 2020

(30) Foreign Application Priority Data

Mar. 22, 2019 (JP) .............................. JP2019-054580

(51) Int. Cl.
*H01L 23/00* (2006.01)

(52) U.S. Cl.
CPC .... *H01L 24/46* (2013.01); *H01L 2924/01013* (2013.01); *H01L 2924/01029* (2013.01); *H01L 2924/01047* (2013.01); *H01L 2924/01079* (2013.01); *H01L 2924/30101* (2013.01)

(58) Field of Classification Search
CPC ...................................................... H01L 24/46
USPC ........................................................ 257/784
See application file for complete search history.

(56) References Cited

U.S. PATENT DOCUMENTS

2011/0049505 A1 3/2011 Grabowski et al.
2017/0077012 A1* 3/2017 Kosaka ............. H01L 23/49562

FOREIGN PATENT DOCUMENTS

| DE | 10 2009 029 040 A1 | 3/2011 |
| DE | 10 2016 216 702 A1 | 3/2017 |
| JP | H04-147635 A | 5/1992 |
| JP | H08-195411 A | 7/1996 |

OTHER PUBLICATIONS

Office Action issued in DE 10 2020 203 2491; mailed by the German Patent and Trademark Office dated Mar. 31, 2020.

* cited by examiner

*Primary Examiner* — Ajay Arora
(74) *Attorney, Agent, or Firm* — Studebaker & Brackett PC

(57) ABSTRACT

A semiconductor device includes a semiconductor element, a terminal electrode, and internal wiring. The semiconductor element is housed in a case. The terminal electrode is provided electrically connectable to an outside of the case. The internal wiring is provided in the case and electrically connects the semiconductor element and the terminal electrode. The internal wiring includes a fuse portion provided at a part of the internal wiring and configured to be melted by an overcurrent. The fuse portion includes a plurality of metal wires which are a group of parallel wires. Of the plurality of metal wires, a first metal wire is higher in resistance value than a second metal wire laid on an outer side relative to the first metal wire.

8 Claims, 3 Drawing Sheets

_US 11,152,327 B2_

SEMICONDUCTOR DEVICE WITH FUSE PORTION COMPRISING WIRES OF DIFFERENT ELECTRICAL RESISTANCE

BACKGROUND OF THE INVENTION

Field of the Invention

The present invention relates to a semiconductor device.

Description of the Background Art

Conventionally, when an electronic component such as a capacitor in a semiconductor module has a short circuit fault, an excessive short-circuit current flows through a semiconductor device included in the semiconductor module to damage the semiconductor module. Furthermore, since a current exceeding a rated current flows through the semiconductor device, the degree of damage of the semiconductor module increases.

Japanese Patent Application Laid-Open No. H08-195411 (1996) discloses a power module element that uses a part of wiring connected to a chip of a power switching element as a fuse. For the power module disclosed in Japanese Patent Application Laid-Open No. H08-195411 (1996), a fuse characteristic of a plate fuse is adjusted through a change of an amount of cut made to the plate fuse. Alternatively, the fuse characteristic is adjusted through a change of the number, thickness, or length of bonding wires. For example, when the fuse portion is formed of a plurality of bonding wires, the cross-sectional area of each of the bonding wires needs to be reduced in order to cause all the bonding wires to melt without fail.

When the fuse characteristic is adjusted through an adjustment to the cross-sectional area of the current path, the cross-sectional area of the fuse portion is smaller than the cross-sectional area of the current path before and after the fuse portion. For example, the minimum cross section of the current path corresponds to the fuse portion.

Since the minimum cross section has a high resistance, the minimum cross section becomes a heat source while the semiconductor device is in normal operation. This increases the temperature of the semiconductor device while the semiconductor device is in normal operation and therefore adversely affects other electronic components and the like.

SUMMARY

An object of the present invention is to provide a semiconductor device that guarantees a stable fuse characteristic and can prevent an increase in loss in a fuse portion during normal use.

A semiconductor device according to the present invention includes a semiconductor element, a terminal electrode, and internal wiring. The semiconductor element is housed in a case. The terminal electrode is provided electrically connectable to an outside of the case. The internal wiring is provided in the case and electrically connects the semiconductor element and the terminal electrode. The internal wiring includes a fuse portion provided at a part of the internal wiring and configured to be melted by an overcurrent. The fuse portion includes a plurality of metal wires which are a group of parallel wires. Of the plurality of metal wires, a first metal wire is higher in resistance value than a second metal wire laid on an outer side relative to the first metal wire.

According to the present invention, it is possible to provide a semiconductor device that guarantees a stable fuse characteristic and prevents an increase in loss during normal use.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
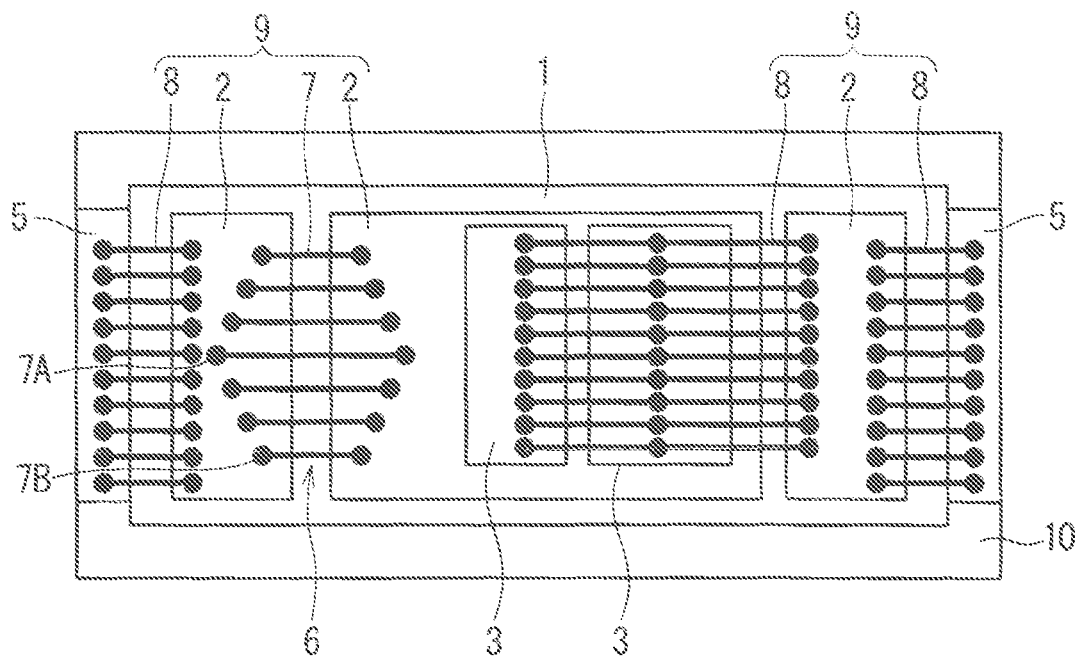
FIG. 1 is a plan view of a structure of a semiconductor device according to a first preferred embodiment.

FIG. 1 is a plan view of a structure of a semiconductor device according to a first preferred embodiment. The semiconductor device includes an insulation substrate 1, a case 10, a semiconductor element 3, a terminal electrode 5, and internal wiring 9.

The insulation substrate 1 includes an insulation material as a base material. The insulation substrate 1 includes a circuit pattern 2 having conductivity provided on a main surface, and includes a heat dissipation pattern (not shown) provided on a surface opposite from the main surface. As shown in FIG. 1, three circuit patterns 2 are provided on the main surface of the insulation substrate 1, for example. The circuit pattern 2 is, for example, printed wiring.

The case 10 has a frame shape. The case 10 is provided to surround an outer peripheral portion of the insulation substrate 1 with its frame shape.

The semiconductor element 3 is housed in the case 10 and held on the main surface of the insulation substrate 1. According to the first preferred embodiment, two semiconductor elements 3 are arranged on one circuit pattern 2. The semiconductor element 3 is, for example, an insulated gate bipolar transistor (IGBT), a metal oxide semiconductor field effect transistor (MOSFET), a Schottky barrier diode, or the like. The semiconductor element 3 includes a wide band gap semiconductor such as SiC or GaN as a material. The semiconductor element 3 is, for example, a power semiconductor element.

The terminal electrode 5 is provided electrically connectable to an external circuit (not shown) provided outside the case 10. Herein, the terminal electrode 5 is provided on the case 10.

The internal wiring 9 is provided in the case 10 and includes a plurality of metal wires 8 and the circuit patterns 2 described above. The plurality of metal wires 8 are, for example, bonding wires. The plurality of metal wires 8 connect the two semiconductor elements 3, the semiconductor element 3 and the circuit pattern 2, and the circuit pattern 2 and the terminal electrode 5. Such a structure causes the internal wiring 9 to electrically connect the semiconductor element 3 and the terminal electrode 5. Further, the number of the plurality of metal wires 8 is equal to or greater than the number of a plurality of metal wires 7 constituting a fuse portion 6 to be described later. Therefore, the plurality of metal wires 8 is less liable to melt than the fuse portion 6. Note that the plurality of metal wires 8 have been given as an example, and the wiring that electrically connects the semiconductor element 3 and the terminal electrode 5 is not limited to a metal wire such as a bonding wire. The wiring connecting the semiconductor element 3 and the terminal electrode 5 only needs to be less liable to melt than the fuse portion 6.

The insulation substrate 1, the semiconductor element 3, and the internal wiring 9 are encapsulated in a sealing material (not shown) in the case 10.

The internal wiring 9 further includes the fuse portion 6 provided at a part of the internal wiring 9 and configured to be melted by an overcurrent. In other words, the fuse portion 6 serves as a fuse. The fuse portion 6 includes the plurality of metal wires 7 which are a group of parallel wires. The group of parallel wires corresponds to, for example, a structure where the plurality of metal wires 7 form the same single internal wiring 9 (current path). That is, one ends of the plurality of metal wires 7 are branched from the same single internal wiring 9, and the other ends are also branched from the same single internal wiring 9.

Of the plurality of metal wires 7, one metal wire 7A is higher in resistance value than other metal wires 7B laid on outer sides relative to the one metal wire 7A. According to the first preferred embodiment, of the plurality of metal wires 7, the metal wire 7A laid on a center side is longer than the metal wires 7B laid on the outer sides relative to the metal wire 7A. Therefore, the metal wire 7A laid on the center side is higher in resistance value than the metal wires 7B laid on the outer sides relative to the metal wire 7A.

The resistance values of the plurality of metal wires 7 are not limited to two different values, and may have at least two different resistance values. For example, as shown in FIG. 1, when the plurality of metal wires 7 are arranged such that their lengths gradually decrease from the center side to the outer sides, the plurality of metal wires 7 have a plurality of different resistance values. For example, of the plurality of metal wires 7, the metal wire 7A laid on the center side has the highest resistance value. Further, the metal wires 7 according to the first preferred embodiment have the same thickness, but may have different thicknesses.

Further, the plurality of metal wires 7 serving as the fuse portion 6 are preferably provided to connect two regions located between the semiconductor element 3 and the terminal electrode 5. Each of the two regions is, for example, the semiconductor element 3, the terminal electrode 5, or the circuit pattern 2. The plurality of metal wires 7 according to the first preferred embodiment are provided to connect two circuit patterns 2.

Each of the plurality of metal wires 7 is, for example, a bonding wire. Each of the plurality of metal wires 7 is made of aluminum, gold, silver, or copper. Alternatively, each of the plurality of metal wires 7 is made of an alloy containing aluminum, gold, silver, or copper.

While the semiconductor device is in normal operation, a current path is maintained by both the metal wire 7A laid on the center side and the metal wires 7B laid on the outer sides. This causes the semiconductor device to prevent an increase in circuit temperature caused by heat generated in the fuse portion 6 formed of the plurality of metal wires 7. On the other hand, when a current exceeding a rated current flows through the plurality of metal wires 7, that is, when overcurrent occurs, a difference arises between a value of current flowing through the metal wire 7A laid on the center side and a value of current flowing through the metal wires 7B laid on the outer sides. This is because the metal wire 7A laid on the center side and the metal wires 7B laid on the outer sides are different from each other in resistance value. Of the plurality of metal wires 7, the metal wires 7B laid on the outer sides generate a larger amount of heat and melt first. As a result, a plurality of metal wires including the metal wire 7A laid on the center side relative to the metal wires 7B laid on the outer sides remain as the current path. A current flows through the plurality of remaining metal wires, and similarly, another metal wire laid on the outer side generates a larger amount of heat and then melt. After such melting repeated, only the metal wire 7A laid on the center side remains as the current path. Then, a current concentrates on the metal wire 7A laid on the center side, and the metal wire 7A also melts. Eventually, all the plurality of metal wires 7 melt, thereby interrupting the current path of overcurrent and protecting the circuit in the semiconductor device from being broken by overcurrent.

When the fuse portion is formed of a plurality of metal wires all having the same resistance value, all the metal wires melt at the same time when overcurrent occurs. Thus, high energy is required for the melting and it takes some time for causing all the metal wires to melt. On the other hand, when overcurrent occurs in the fuse portion 6 according to the first preferred embodiment, the metal wires sequentially melt from the metal wires 7B laid on the outer sides, and lastly, the metal wire 7A melts. Since the plurality of metal wires 7 melts one by one, energy required for the melting is small. Such a fuse portion 6 has an effect of interrupting the current within a minimum time to prevent the circuit from being broken.

In summary, the semiconductor device according to the first preferred embodiment includes the semiconductor element 3, the terminal electrode 5, and the internal wiring 9. The semiconductor element 3 is housed in the case 10. The terminal electrode 5 is provided electrically connectable to an outside of the case 10. The internal wiring 9 is provided in the case 10 and electrically connects the semiconductor element 3 and the terminal electrode 5. The internal wiring 9 includes the fuse portion 6 provided at a part of the internal wiring 9 and configured to be melted by an overcurrent. The fuse portion 6 includes the plurality of metal wires 7 which are a group of parallel wires. Of the plurality of metal wires 7, the one metal wire 7A (the first metal wire) is higher in resistance value than the other metal wires 7B (the second metal wires) laid on the outer sides relative to the one metal wire 7A.

Such a semiconductor device guarantees a stable fuse characteristic and prevents an increase in loss in the fuse portion 6 during normal use. The semiconductor device makes it possible to maximize a cross-sectional area of a main current path while satisfying the fuse characteristic for overcurrent, for example. For example, when a current exceeding the rated current value flows through the fuse portion 6 formed of a plurality of bonding wires, all the bonding wires melt without fail.

Since the fuse portion 6 is formed of the plurality of metal wires 7, while the semiconductor device is in normal operation, a current path is maintained by both the metal wire 7A laid on the center side and the metal wires 7B laid on the outer sides. This causes the semiconductor device to prevent an increase in circuit temperature caused by heat generated in the fuse portion 6 formed of the plurality of metal wires 7.

On the other hand, since the resistance value of the metal wire 7A laid on the center side and the resistance value of the metal wires 7B laid on the outer sides are different from each other, when a current exceeding the rated current flows through the plurality of metal wires 7, a difference arises between the value of current flowing through the metal wire 7A laid on the center side and the value of current flowing through the metal wires 7B laid on the outer sides. The plurality of metal wires 7 sequentially melt in the order from the metal wires 7B that are laid on the outer sides and generate a larger amount of heat to the metal wire 7A laid on the center side, and all the metal wires 7 melts in the end. This causes the semiconductor device to protect the circuit from being broken when overcurrent occurs.

Further, a metal wire higher in resistance is intentionally provided in the plurality of metal wires 7, which makes it easy to identify a location of a metal wire that is broken when overcurrent occurs. Further, the semiconductor device according to the first preferred embodiment allows the cross-sectional area of the fuse portion 6 to increase as large as possible. Such a semiconductor device is applicable to, for example, power generation and power transmission, or to efficient use and regeneration of energy.

Further, the plurality of metal wires 7 according to the first preferred embodiment have at least two different resistance values as the resistance value of each of the plurality of metal wires 7.

Since current values at which the metal wires 7 melt when overcurrent occurs are different from each other, such a semiconductor device maintains both the fuse characteristic and the current path while the semiconductor device is in normal operation for various levels of overcurrent.

Further, the internal wiring 9 according to the first preferred embodiment further includes the circuit pattern 2. The circuit pattern 2 has conductivity and is laid on the main surface of the insulation substrate 1 provided in the case 10. The plurality of metal wires 7 connect the two regions located between the semiconductor element 3 and the terminal electrode 5. Each of the two regions is the semiconductor element 3, the terminal electrode 5, or the circuit pattern 2.

Such a semiconductor device can provide a structure suitable for the fuse portion 6 formed of bonding wires.

Further, each of the plurality of metal wires 7 according to the first preferred embodiment is a bonding wire.

Such a semiconductor device makes it possible to adjust the resistance value of each of the plurality of metal wires 7 forming the fuse portion 6 based on the length of the bonding wire.

Further, each of the plurality of metal wires 7 according to the first preferred embodiment is made of aluminum, gold, silver, or copper. Alternatively, each of the plurality of metal wires 7 is made of an alloy containing aluminum, gold, silver, or copper.

Such a semiconductor device allows the resistance values of the plurality of metal wires 7 to be adjusted with various materials and combinations of the materials.

Second Preferred Embodiment

A semiconductor device according to a second preferred embodiment will be described. Note that no descriptions will be given of structure and operation identical to the structure and operation of the first preferred embodiment.

Figure 2:
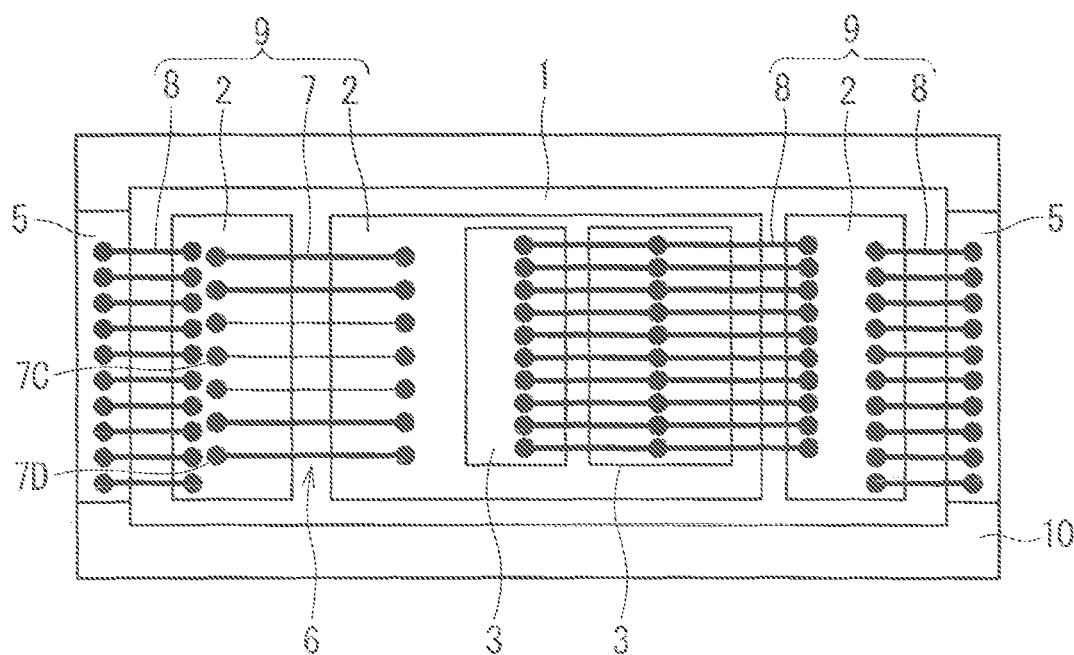
FIG. 2 is a plan view of a structure of a semiconductor device according to a second preferred embodiment.

FIG. 2 is a plan view of a structure of the semiconductor device according to the second preferred embodiment. The semiconductor device according to the second preferred embodiment is different from the semiconductor device according to the first preferred embodiment in structure of the plurality of metal wires 7.

According to the second preferred embodiment, of the plurality of metal wires 7, a metal wire 7C laid on the center side is smaller in cross-sectional area than a metal wire 7D laid on the outer side. For example, as shown in FIG. 2, three metal wires 7C laid on the center side are smaller in cross-sectional area than four metal wires 7D laid on the outer sides. Accordingly, the metal wires 7C laid on the center side are higher in resistance value than the metal wires 7D laid on the outer sides.

Such a semiconductor device guarantees a stable fuse characteristic and prevents an increase in loss in the fuse portion 6 during normal use.

Since the fuse portion 6 is formed of the plurality of metal wires 7, while the semiconductor device is in normal operation, a current path is maintained by both the metal wires 7C laid on the center side and the metal wires 7D laid on the outer sides. This causes the semiconductor device to prevent an increase in circuit temperature caused by heat generated in the fuse portion 6 formed of the plurality of metal wires 7.

On the other hand, since the resistance value of the metal wires 7C laid on the center side and the resistance value of the metal wires 7D laid on the outer sides are different from each other, when overcurrent occurs in the plurality of metal wires 7, a difference arises between a value of current flowing through the metal wires 7C laid on the center side and a value of current flowing through the metal wires 7D laid on the outer sides. Of the plurality of metal wires 7, the metal wires 7D laid on the outer sides generate a larger amount of heat and melt first. Thereafter, the metal wires 7C laid on the center side melt, and all the metal wires 7 melt in the end. This causes the semiconductor device to protect the circuit from being broken when overcurrent occurs.

Further, such a semiconductor device allows the resistance value of each of the plurality of metal wires 7 forming the fuse portion 6 to be adjusted based on the size of the cross-sectional area of each of the plurality of metal wires 7. The semiconductor device maintains both the fuse characteristic and the current path while the semiconductor device is in normal operation for various levels of overcurrent.

Third Preferred Embodiment

A semiconductor device according to a third preferred embodiment will be described. Note that no descriptions will be given of structure and operation identical to the structure and operation of the first or second preferred embodiment.

When a current exceeding the rated current flows through the plurality of metal wires 7 serving as the fuse portion 6, a difference arises between a value of current flowing through the metal wire 7A laid on the center side and a value of current flowing through the metal wires 7B laid on the outer sides shown in FIG. 1, for example. Permissible degree of melting that is one of the fuse characteristics of the metal wires 7 is determined based on the difference in current value. For example, when the difference in current value when overcurrent occurs is small, the plurality of metal wires 7 melt at the same time. Thus, high energy is required for the melting and it takes some time for causing all the metal wires to melt. However, when the difference in current value is large, the metal wires 7 sequentially melt in the order from the metal wires 7B laid on the outer sides to the metal wire 7A laid on the center side. Since the plurality of metal wires 7 melts one by one, energy required for the melting is small. Such a fuse portion 6 can interrupt the current within a minimum time to prevent the circuit from being broken.

The semiconductor device according to the third preferred embodiment satisfies a relation represented by an expression (1) where $\Delta I$ denotes the difference in current value, I denotes the value of current flowing through the plurality of metal wires 7, n denotes the number of the plurality of metal wires 7, Imax denotes the maximum current value of a plurality of currents each flowing through a corresponding one of the plurality of metal wires 7, and Imin denotes the minimum current value of the plurality of currents. Herein, the value of current flowing through the plurality of metal wires 7 denoted by I corresponds to the sum of the values of currents flowing through the metal wires 7.

$$\Delta I=(Imax-Imin)/(I/n)>50\% \qquad (1)$$

Figure 3:
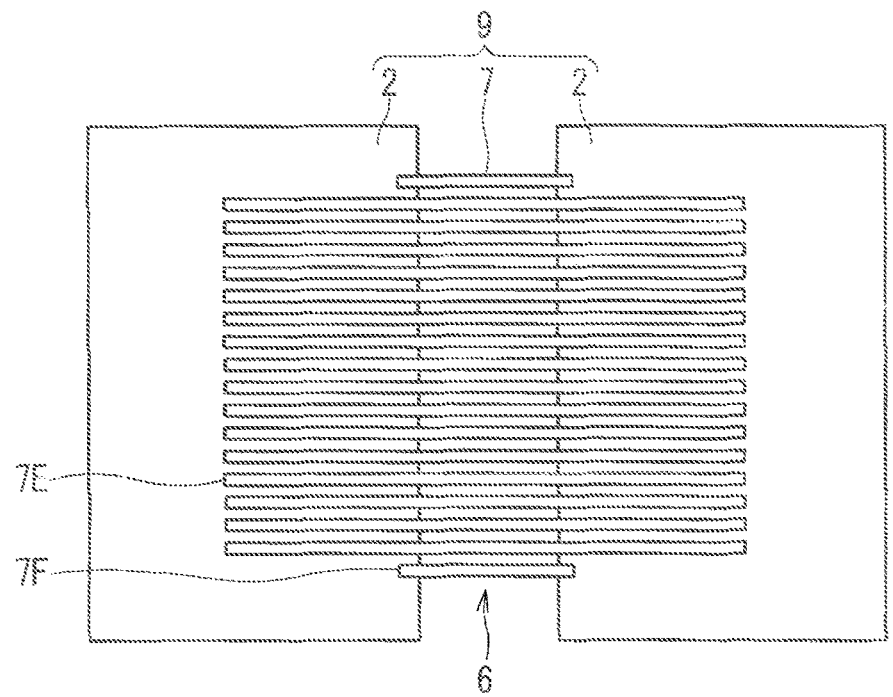
FIGS. 3 and 4 are plan views of structures of a fuse portion of a semiconductor device according to a third preferred embodiment.
Figure 4:
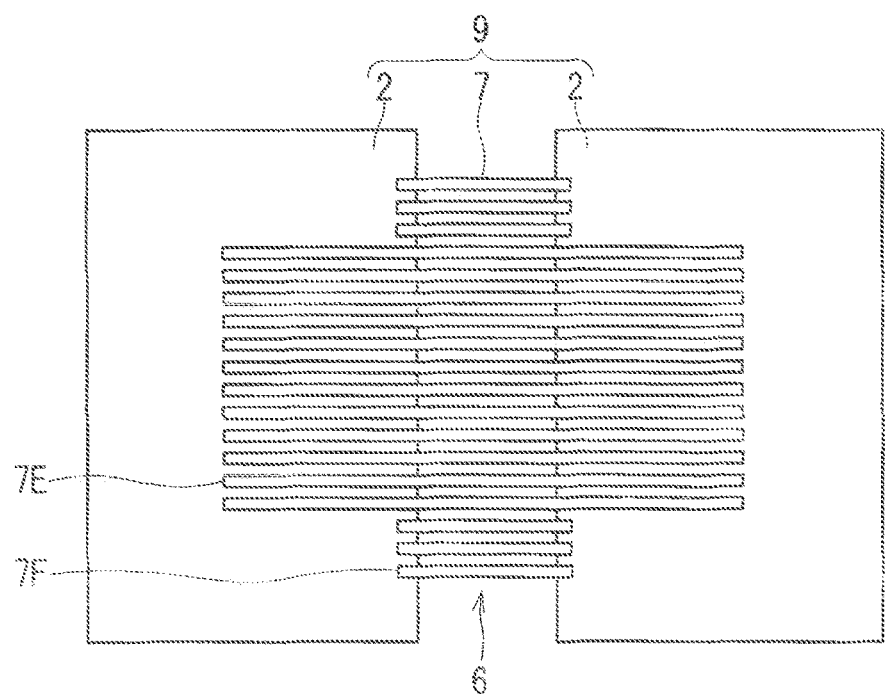

FIGS. 3 and 4 are plan views of structures of the fuse portion 6 of the semiconductor device according to the third preferred embodiment. The fuse portion 6 is formed of 18 metal wires 7 laid between two circuit patterns 2. The metal wires 7 are bonding wires.

In the semiconductor device shown in FIG. 3, of the 18 metal wires 7, two metal wires 7F laid on an outermost sides is shorter than 16 metal wires 7E laid on the center side relative to the metal wires 7F. Herein, the 16 metal wires 7E have the same length. In such a structure, each of the metal wires 7E laid on the center side is higher in resistance value than each of the metal wires 7F laid on the outer sides relative to the metal wires 7E. Therefore, Imax in the expression (1) corresponds to the value of current flowing through each of the two metal wires 7F laid on the outermost sides. Imin corresponds to the value of current flowing through each of the 16 metal wires 7E laid on the center side.

In the semiconductor device shown in FIG. 4, of the 18 metal wires 7, six metal wires including two metal wires 7F laid on the outermost sides and four metal wires 7F laid on inner sides relative to the two metal wires 7F laid on the outermost sides are shorter than 12 metal wires 7E laid on the center side. Therefore, Imax in the expression (1) corresponds to the value of current flowing through each of the six metal wires 7F laid on the outer sides. Imin corresponds to the value of current flowing through each of the 12 metal wires 7E laid on the center side.

Figure 5:
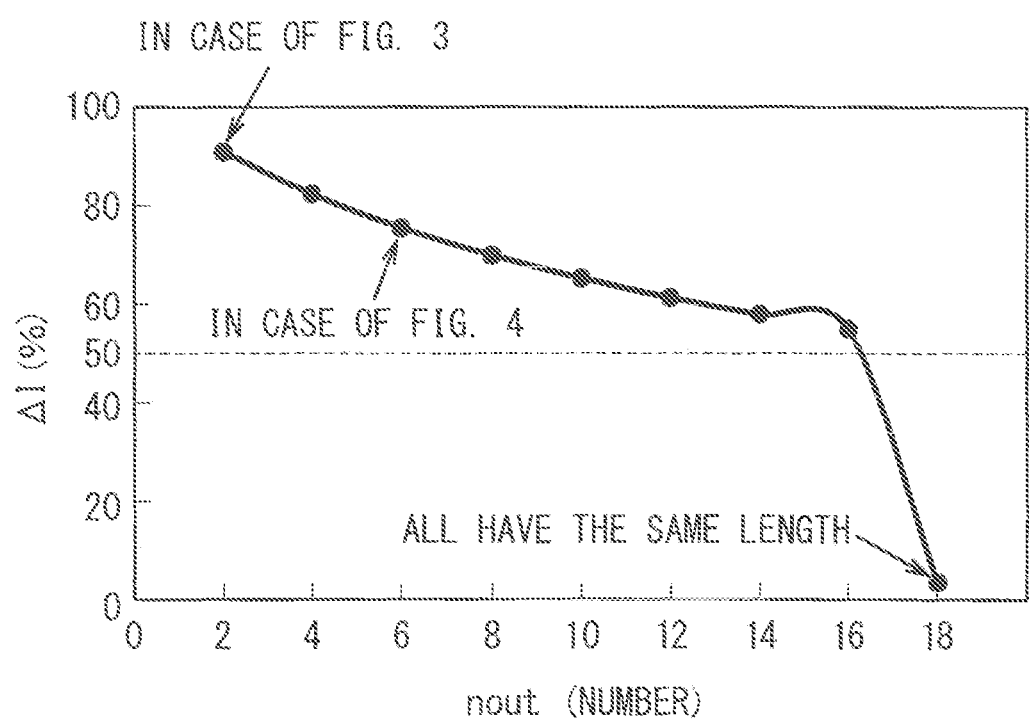
FIG. 5 is a graph showing a relation between nout and ΔI according to the third preferred embodiment.

Herein, of the 18 metal wires 7, the number of the metal wires 7F laid on the outer sides is denoted by nout. FIG. 5 is a graph showing a relation between nout and $\Delta I$ according to the third preferred embodiment. The semiconductor device shown in FIG. 3 corresponds to nout=2. The semiconductor device shown in FIG. 4 corresponds to nout=6.

When the fuse portion 6 is formed of the 18 metal wires 7, and the number of metal wires 7F laid on the outer sides is equal to or less than 16, the semiconductor device satisfies a relation of $\Delta I>50\%$. Further, even when only the two metal wires 7F laid on the outermost sides are shorter than the 16 metal wires 7E laid on the center side, the semiconductor device satisfies a relation of $\Delta I>50\%$.

Such a semiconductor device guarantees a stable fuse characteristic and prevents an increase in loss in the fuse portion 6 during normal use.

The fuse portion 6 according to the third preferred embodiment is formed such that the difference between the values of currents flowing through the plurality of metal wires 7 is equal to or greater than 50%, and therefore, while the semiconductor device is in normal operation, a current path is maintained by both the metal wires 7E laid on the center side and the metal wires 7F laid on the outer sides. This causes the semiconductor device to prevent an increase in circuit temperature caused by heat generated in the fuse portion 6 formed of the plurality of metal wires 7.

On the other hand, since the resistance value of the metal wires 7E laid on the center side and the resistance value of the metal wires 7F laid on the outer sides are different from each other, when overcurrent occurs in the plurality of metal wires 7, a difference arises between a value of current flowing through the metal wires 7E laid on the center side and a value of current flowing through the metal wires 7F laid on the outer sides. Of the plurality of metal wires 7, the metal wires 7F laid on the outer sides generate a larger amount of heat and melt first. Thereafter, the metal wires 7E laid on the center side melt, and all the metal wires 7 melt in the end. This causes the semiconductor device to protect the circuit from being broken when overcurrent occurs.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element housed in a case;
   a terminal electrode provided electrically connectable to an outside of the case; and
   internal wiring provided in the case and electrically connecting the semiconductor element and the terminal electrode, wherein
   the internal wiring includes a wiring portion and a fuse portion connected in series with the wiring portion and provided at a part of the internal wiring,
   the fuse portion includes a plurality of metal wires which are a group of parallel wires and is configured to be melted by an overcurrent,
   the wiring portion includes a plurality of metal wires that are a group of parallel wires different from the group of parallel wires in the fuse portion,
   of the plurality of metal wires in the fuse portion, a first metal wire is higher in resistance value than a second metal wire laid on an outer side relative to the first metal wire, and
   the number of the plurality of metal wires in the fuse portion is less than the number of the plurality of metal wires in the wiring portion.

2. The semiconductor device according to claim 1, wherein
   the plurality of metal wires in the fuse portion have at least two different resistance values as the resistance value of each of the plurality of metal wires in the fuse portion.

3. The semiconductor device according to claim 1, wherein
   the internal wiring further includes a circuit pattern having conductivity and laid on a main surface of an insulation substrate provided in the case, and
   the plurality of metal wires in the fuse portion connect two regions located between the semiconductor element and the terminal electrode,
   each of the two regions is the semiconductor element, the terminal electrode, or the circuit pattern.

4. The semiconductor device according to claim 3, further comprising:

the case; and the insulation substrate, wherein the semiconductor element is held on the main surface of the insulation substrate.

5. The semiconductor device according to claim 1, wherein each of the plurality of metal wires in the fuse portion is a bonding wire.

6. The semiconductor device according to claim 1, wherein each of the plurality of metal wires in the fuse portion is made of aluminum, gold, silver, or copper, or made of an alloy containing aluminum, gold, silver, or copper.

7. The semiconductor device according to claim 1, wherein of the plurality of metal wires in the fuse portion, the first metal wire is smaller in cross-sectional area than the second metal wire laid on the outer side relative to the first metal wire.

8. The semiconductor device according to claim 1, wherein a relational expression of $(I_{max} - I_{min})/(I/n) > 50\%$ is satisfied, where I denotes a value of current flowing through the plurality of metal wires in the fuse portion, n denotes a number of the plurality of metal wires in the fuse portion, Imax denotes a maximum current value of a plurality of currents each flowing through a corresponding one of the plurality of metal wires in the fuse portion, and Imin denotes a minimum current value of the plurality of currents.

\* \* \* \* \*